United States Patent [19]

Nierescher et al.

[11] Patent Number: 5,176,525

[45] Date of Patent: Jan. 5, 1993

[54] MODULAR SOCKET APPARATUS

[75] Inventors: David S. Nierescher; Alan W. Gray, both of King County; Loyd C. Moore, Bellevue, all of Wash.

[73] Assignee: Data I/O Corporation, Redmond, Wash.

[21] Appl. No.: 686,545

[22] Filed: Apr. 17, 1991

[51] Int. Cl.⁵ .................... G01R 31/02; H01R 9/09
[52] U.S. Cl. .................... 439/68; 324/158 F; 439/330
[58] Field of Search .................. 439/55, 68–73, 439/525, 526, 66, 330, 331; 324/158 F

[56] References Cited

U.S. PATENT DOCUMENTS

| | | | |
|---|---|---|---|
| 3,377,514 | 4/1968 | Ruehlemann | 439/68 |
| 3,409,861 | 11/1968 | Barnes | 439/70 |
| 3,904,262 | 9/1975 | Cutchaw | 339/17 |
| 3,954,175 | 5/1976 | Mason | 206/328 |
| 4,079,489 | 3/1978 | Kowalski et al. | 29/33 |
| 4,201,374 | 5/1980 | Gras | 269/37 |
| 4,223,368 | 9/1980 | Dattilo | 361/220 |
| 4,386,463 | 6/1983 | McLaughlin | 29/827 |
| 4,393,579 | 7/1983 | Van Hooreweder | 29/740 |
| 4,457,662 | 7/1984 | Ireland et al. | 414/331 |
| 4,528,747 | 7/1985 | Hoffman et al. | 29/834 |
| 4,536,955 | 8/1985 | Gudgeon | 29/840 |
| 4,556,145 | 12/1985 | Putnam | 206/329 |
| 4,585,121 | 4/1986 | Capelle, Jr. | 206/331 |
| 4,615,441 | 10/1986 | Nakamura | 206/329 |
| 4,620,632 | 11/1986 | Alemanni | 206/329 |
| 4,675,673 | 6/1987 | Oliver | 324/158 F |
| 4,690,275 | 9/1987 | Fritz | 206/331 |
| 4,692,790 | 9/1987 | Oyamada | 357/74 |
| 4,715,835 | 12/1987 | Matsuoka | 439/893 |
| 4,722,135 | 2/1988 | Read | 27/740 |
| 4,725,918 | 2/1988 | Bakker | 361/220 |
| 4,733,462 | 3/1988 | Kawatani | 29/840 |
| 4,746,855 | 5/1988 | Wrinn | 324/158 F |
| 4,765,471 | 8/1988 | Murphy | 206/329 |
| 4,782,289 | 11/1988 | Schwar et al. | 324/158 F |
| 4,815,596 | 3/1989 | Reid | 206/334 |
| 4,868,979 | 9/1989 | Fukushima et al. | 29/840 |
| 4,870,356 | 9/1989 | Tingley | 324/158 F |

Primary Examiner—Neil Abrams
Attorney, Agent, or Firm—Seed and Berry

[57] ABSTRACT

Modular socket technology is disclosed, which includes a contact board mounted to an electronic device for receiving voltage and current signals to be transmitted from the electronic device to a semiconductor circuit. A compression coupler is provided for receiving the semiconductor circuit. The compression coupler includes a printed circuit board having a plurality of conductors mounted to a first side thereof, and extending to a second side thereof for providing electrical contact between the leads of the semiconductor circuit and the contact board. The contact board further includes a resilient conductor adapted to mechanically and electrically engage the plurality of conductors of the compression coupler, thereby to couple voltage and current signals from the electronic device to the semiconductor circuit. The modular socket apparatus may further include a semiconductor carrier for receiving the semiconductor circuit. The compression coupler includes an elastic conductor for conducting voltage and current signals from the plurality of conductors to the leads of the semiconductor circuit. The semiconductor carrier includes a compression pad for engaging the semiconductor circuit to compress the leads of the semiconductor circuit to the elastic conductor, thereby to make mechanical and electrical contact between the leads of the semiconductor circuit and the elastic conductor so that voltage and current signals may be transmitted from the leads of the semiconductor circuit to the electronic device.

24 Claims, 6 Drawing Sheets

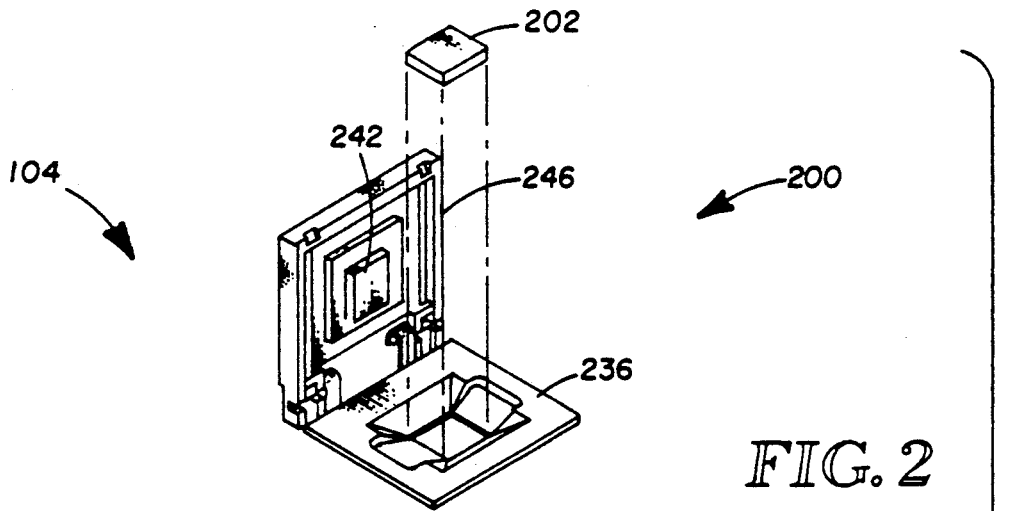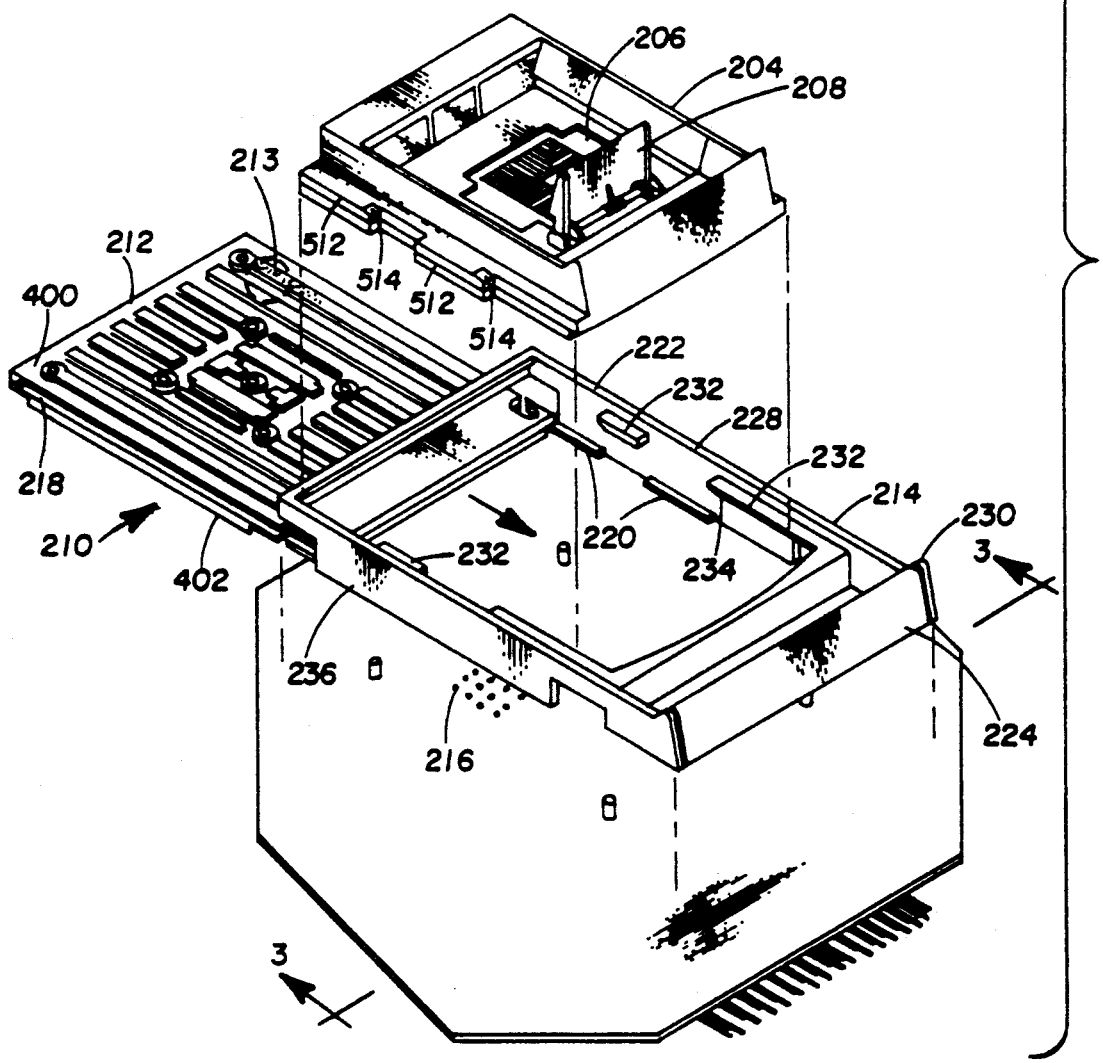
FIG. 2

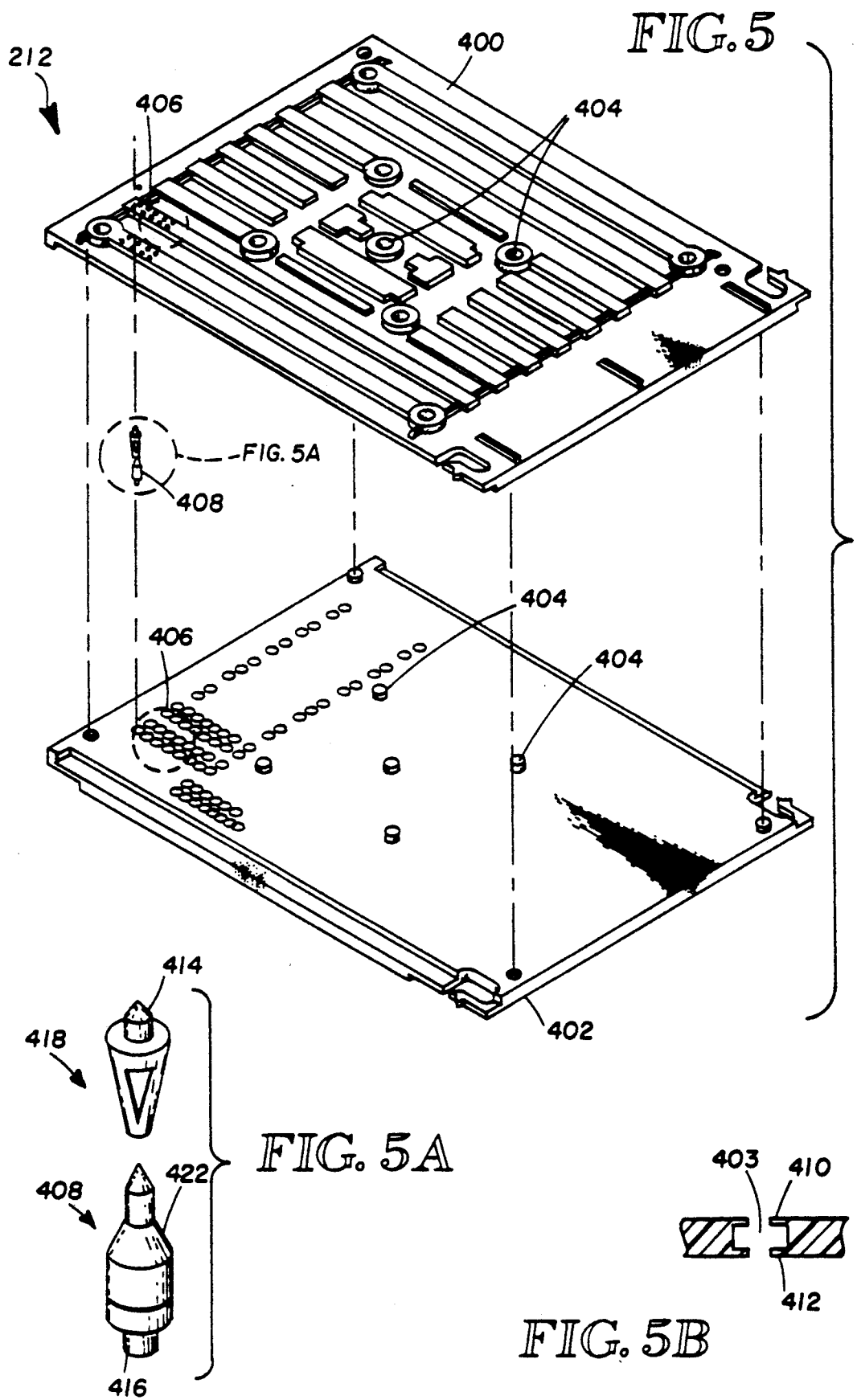

1

MODULAR SOCKET APPARATUS

DESCRIPTION

1. Technical Field

The present invention is directed toward an apparatus for removably coupling semiconductor circuits to electronic devices and, more particularly, toward an apparatus for removably coupling a plurality of semiconductor circuits having different package configurations to electronic devices.

2. Background of the Invention

Semiconductor circuits have become more than commonplace in today's society, finding application in virtually all electric and/or electronic devices. Early semiconductor circuits typically were constructed in dual in-line packages (DIP's) that include a plurality of substantially inflexible leads extending laterally outward from the package and bent downward toward the bottom of the package. However, with the advent of automated soldering technology, and with the continuing progression in the art of constructing smaller semiconductor circuits, the package configurations of semiconductor circuits have become widely varying. Semiconductor circuits now may be found in small outline integrated circuits (SOIC's), quad flatbacks, plastic leaded chip carriers (PLCC's), and leadless chip carriers (LCC's). These package configurations differ in size, shape, and the manner in which the leads extend from the semiconductor device. As an example, a small outline integrated circuit (SOIC) typically has leads that extend outward laterally from the semiconductor circuit body, and are bent downward and subsequently bent outward. These leads are relatively flexible in comparison to the leads of semiconductor circuits configured in dual in-line packages (DIP's). As another example, a plastic-leaded chip carrier (PLCC) typically has relatively flexible leads that extend outward laterally from the body of the semiconductor circuit and are bent downwardly and inwardly, so that the leads curl under the body of the semiconductor circuit. Each of the packages discussed above may be found in varying sizes.

Although the varying size and construction of semiconductor circuit packages provides relatively insubstantial inconvenience to product makers and manufacturers who are soldering these devices into electric and electronic circuits for mass production, the variety in size and construction of semiconductor circuits provides substantial hardship to the designer, semiconductor circuit programmer, or manufacturing test technician who desires to electrically couple a plurality of semiconductor circuit packages to an electric or electronic circuit under design or test. As an example, programmable semiconductor circuits must be removably coupled to a circuit programmer to receive voltage and current signals necessary for implanting or programming data into the semiconductor circuit. Presently available programming apparatus typically provides a plurality of sockets mounted on the programmer, wherein each socket is constructed for receiving a semiconductor package of a particular construction and/or size. As will be readily apparent, this method of coupling semiconductor circuits to programming apparatus is both expensive and impractical, since a separate socket is needed for each package configuration and each size within each configuration. Accordingly, it is desirable to provide a method and apparatus for inexpensively coupling a plurality of semiconductor circuit package configuration and size to electronic devices.

Further, with particular respect to programming apparatus, prior art devices for coupling a semiconductor circuit to a programmer require that the voltage and current signals provided from the programmer to the semiconductor circuit be conducted over relatively long wires, thereby increasing inductance and decreasing the efficacy of the programming. Although such devices are adequate for early models of semiconductor circuits in which the programming times are extremely long, newer semiconductor circuit technology requires shorter programming times at higher currents, thereby increasing the inductance introduced in the voltage and current signals by the long wires. Accordingly, it is desirable to provide an apparatus for coupling a plurality of semiconductor circuits to a programming apparatus in which the length of wire for conducting the programming voltage and current signals between the semiconductor and the programming apparatus is minimized.

SUMMARY OF THE INVENTION

The present invention comprises a modular socket apparatus for removably coupling a plurality of semiconductor circuits to an electronic device. In accordance with the subject invention, the plurality of semiconductor circuits each includes a plurality of leads and may have differing package constructions. The modular socket apparatus includes a contact board for receiving voltage and current signals from the electronic device. The contact board is fixed to the electronic device and includes a first plurality of conductors electrically coupled to the electronic device. A compression coupler is provided for receiving the semiconductor circuit. The compression coupler includes a printed circuit board having first and second sides and is constructed for removable mounting of the semiconductor circuit on its first side. The printed circuit board also includes a second plurality of conductors for coupling to the leads of the semiconductor circuit. The second plurality of conductors includes a plurality of contacts positioned on the second side of the printed circuit board, opposite the first side. The compression coupler is removably coupled to the contact board for establishing electrical contact between the first and second plurality of conductors, thereby transmitting voltage and current signals between the compression coupler and the contact board.

In a presently preferred embodiment of the invention, the compression coupler includes an elastic conductor providing springable and electrical engagement between the leads of the semiconductor circuit and the first plurality of conductors, thereby conducting volatage and current signals between the first plurality of conductors and the leads of the semiconductor circuit. The modular socket apparatus also preferably includes a semiconductor carrier for receiving the semiconductor circuit. The semiconductor carrier includes a compression pad engaging the semiconductor circuit for compressing the leads of the semiconductor circuit to the elastic conductor. The compression coupler further includes an apparatus for receiving the semiconductor carrier and for compressing the semiconductor carrier to the printed circuit board so that the compression pad engages the semiconductor circuit and compresses the leads of the semiconductor circuit to the elastic conductor.

BRIEF DESCRIPTION OF THE DRAWINGS

FIG. 2 is an exploded isometric view of the modular socket apparatus;

FIG. 5 is an exploded isometric view of a contact board illustrated in FIG. 2;

FIG. 5A is an exploded isometric view of a compliant pin illustrated in FIG. 5;

FIG. 5B is a partial sectional view of the contact board illustrated in FIG. 2;

DETAILED DESCRIPTION OF THE INVENTION

Figure 1:
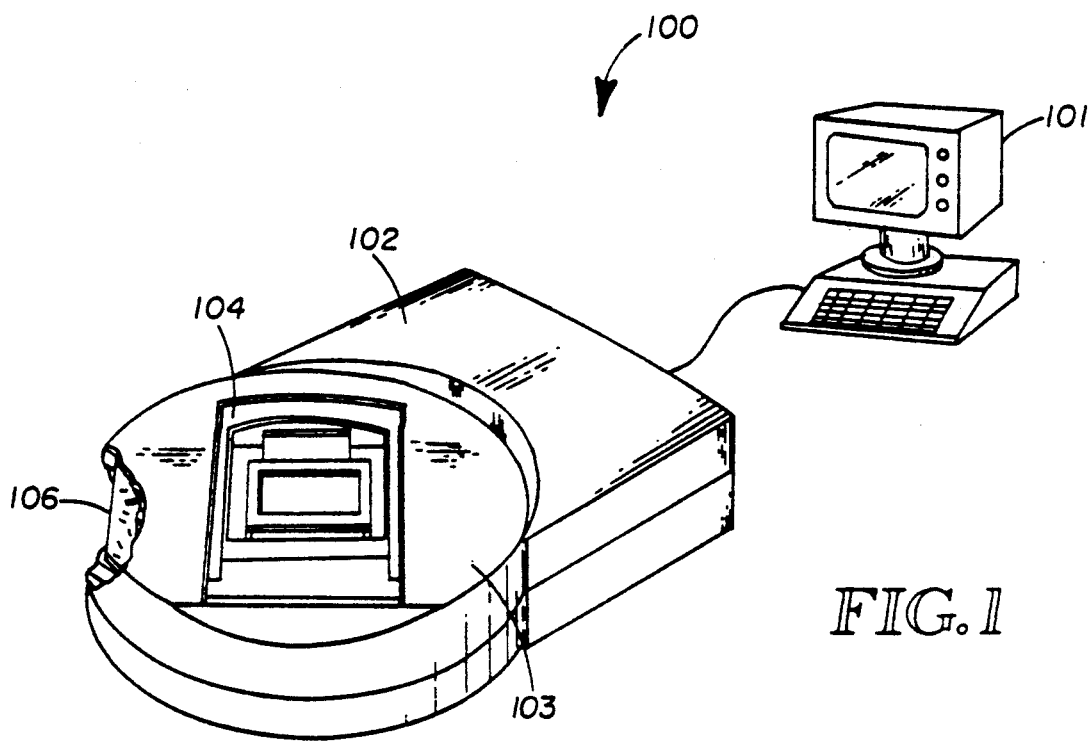
FIG. 1 is a perspective view of a semiconductor programmer including the novel modular socket apparatus that is the subject of the present invention.

A novel semiconductor programmer 100 is illustrated in FIG. 1. The semiconductor programmer 100 is provided for receiving a plurality of semiconductor circuits which are to be programmed with voltage and current signals to perform predetermined functions. The semiconductor circuits have a plurality of circuit configurations. Examples of semiconductor circuits that may be programmed using the semiconductor programmer 100 include programmable read only memory (PROM), erasable programmable read only memory (EPROM), gate arrays, etc. As is known in the art, the semiconductor programmer 100 is constructed to be coupled to a data processor 101 for interfacing a user with the semiconductor programmer 100.

The semiconductor programmer 100 includes a housing 102 in which is mounted electronic circuitry necessary for providing the appropriate voltage and current signals to the semiconductor circuits to be programmed. In accordance with the present invention, a modular socket 104 is mounted to the housing 102 of the semiconductor programmer 100. The modular socket 104 is constructed for receiving a plurality of semiconductor circuits each having a unique physical configuration. The modular socket 104 electrically interfaces the plurality of semiconductor circuits with a relay board 106 mounted within the housing 102 of the semiconductor programmer 100 to provide the electrical voltage and current signals for programming the circuits.

Figure 7:
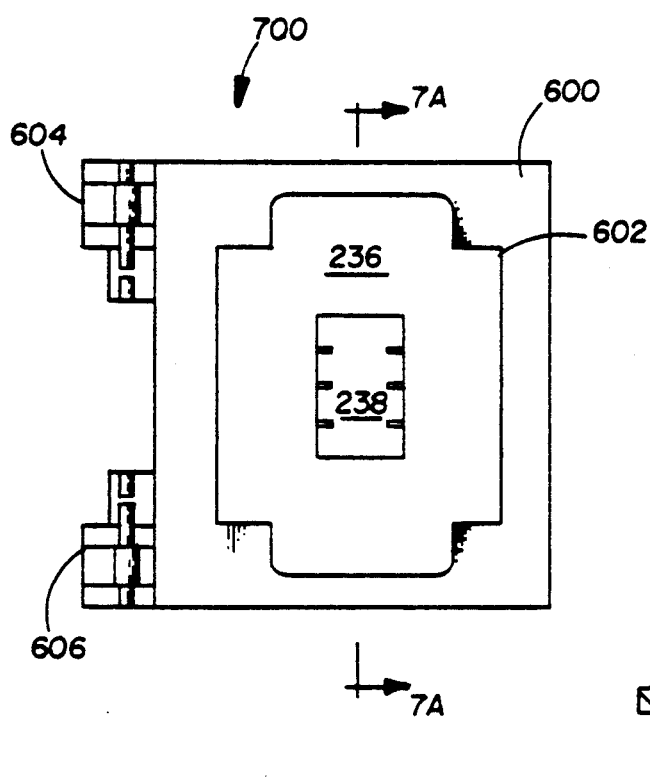
FIG. 7 is a top plan view of the semiconductor carrier illustrated in FIG. 2.
Figure 7A:
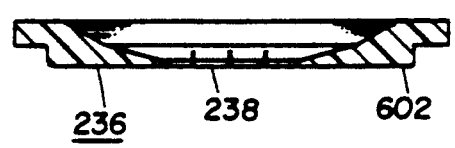
FIG. 7A is a sectional view of the semiconductor carrier illustrated in FIG. 7.

With reference to FIG. 2, a more detailed description of the modular socket 104 may be provided. The modular socket 104 is illustrated in greater detail in FIG. 2. The modular socket 104 includes a semiconductor carrier 200 for receiving a semiconductor circuit 202 to be programmed by the semiconductor programmer 100. The semiconductor carrier 200 receives the semiconductor circuit 202 and electrically and physically couples the semiconductor circuit 202 to a compression coupler 204. As will be described in more detail by reference to FIG. 7, the semiconductor carrier 200 may have a plurality of configurations for receiving semiconductor circuit 202 having differing package constructions. Since the cost of providing the semiconductor carrier 200 is relatively small, a unique carrier having a unique internal construction may be provided for receiving each semiconductor circuit package construction. However, each semiconductor carrier 200 has a predetermined external construction for mating with the compression coupler 204. In this manner, a plurality of semiconductor carriers may be used to transform the varying size and shape of a plurality of semiconductor circuits to the predetermined size and shape of the semiconductor carrier 200.

The compression coupler 204 includes a printed circuit board 206 to which electrical contact is made with the leads of the semiconductor circuit 202. The compression coupler 204 also includes a securing clip 208 for lockably receiving the semiconductor carrier 200, as will be described in more detail by reference to FIG. 6. The compression coupler 204 makes electrical contact with semiconductor circuits having a wide variety of pin configurations so that the compression coupler 204 may receive semiconductor carriers that accommodate an equally wide variety of semiconductor circuit pin configurations. The compression coupler 204 has a predetermined board contact pattern, as will be discussed more fully below by reference to FIG. 6. The compression coupler 204 is used to transform the varying pin constructions of a plurality of semiconductor circuits to the predetermined board contact pattern of the compression coupler 204. Those skilled in the art will recognized that the combination of the compression coupler 204 and a plurality of semiconductor carriers 200 may be used to transform the varying size, shape, and pin configurations of a plurality of semiconductor circuit packages to the predetermined size, shape, and board contact pattern of the compression coupler 204.

The compression coupler 204 is removably coupled to a contact board assembly 210. The contact board assembly 210 includes a compliant pin assembly 212 that is fixed to the exterior surface 103 of the semiconductor programmer housing 102. The compliant pin assembly 212 includes a plurality of conductors 213 positioned to mate with the predetermined board contact pattern of the compression coupler 204. The compliant pin assembly 212 is positioned for electrical contact with the relay board 106, positioned interior of the semiconductor programmer housing 102 as best illustrated in FIG. 1. The contact board assembly 210 further includes a compression handle 214 slidably mounted to the compliant pin assembly 212 for engaging the compression coupler 204 to physically couple and secure the compression coupler 204 to the compliant pin assembly 212, thereby making electrical contact between the printed circuit board 206 of the compression coupler 204 and the compliant pin assembly 212.

Accordingly, to removably couple the semiconductor circuit 202 to the semiconductor programmer 100, the semiconductor circuit is placed within the semiconductor carrier 200 and the combination secured to the compression coupler 204. The compression coupler 204 is then mounted on the compliant pin assembly 212 and compressed thereto by the compression handle 214. Thereafter the semiconductor circuit 202 is physically and electrically secured to the semiconductor programmer 100. Semiconductor circuits having differing package configurations can be coupled to the semiconductor programmer 100 by providing a unique semiconductor carrier 200 for coupling the semiconductor circuit to the compression coupler 204. Those skilled in the art will appreciate that since the semiconductor carrier 200 can be inexpensively manufactured, the modular socket 104 provides an inexpensive method for coupling a plurality of semiconductor circuits of varying package construction to the semiconductor programmer 100.

Figure 3:
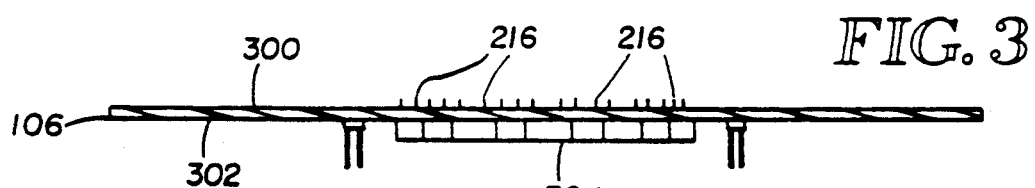
FIG. 3 is a cross-sectional view of a relay board used in the semiconductor programmer illustrated in FIG. 1.

The manner in which the semiconductor programmer 100 is electrically coupled to the contact board assembly 210 may be described in more detail by reference to FIG. 3. Therein, the relay board 106 is shown to include a first side 300 opposite a second side 302. When positioned interior of the semiconductor programmer housing 102, the first side 300 of the relay board 106 is positioned proximate the exterior surface 103 of the housing 102 facing outward toward the compliant pin assembly 212 (FIGS. 1 and 2). A plurality of compliant pin contacts 216 are positioned on the first side 300 of the relay board 106 and extend transversely through the relay board 106 to make electrical contact with a plurality of relays 304 (FIG. 3). The plurality of compliant pin contacts 216 are arranged in the predetermined board contact pattern of the compression coupler 204 (FIG. 2). The plurality of relays 304 are provided for selectively coupling a supply voltage, a reference voltage, and a plurality of pin driver units to one or more of the plurality of compliant pin contacts 216.

Figure 4:
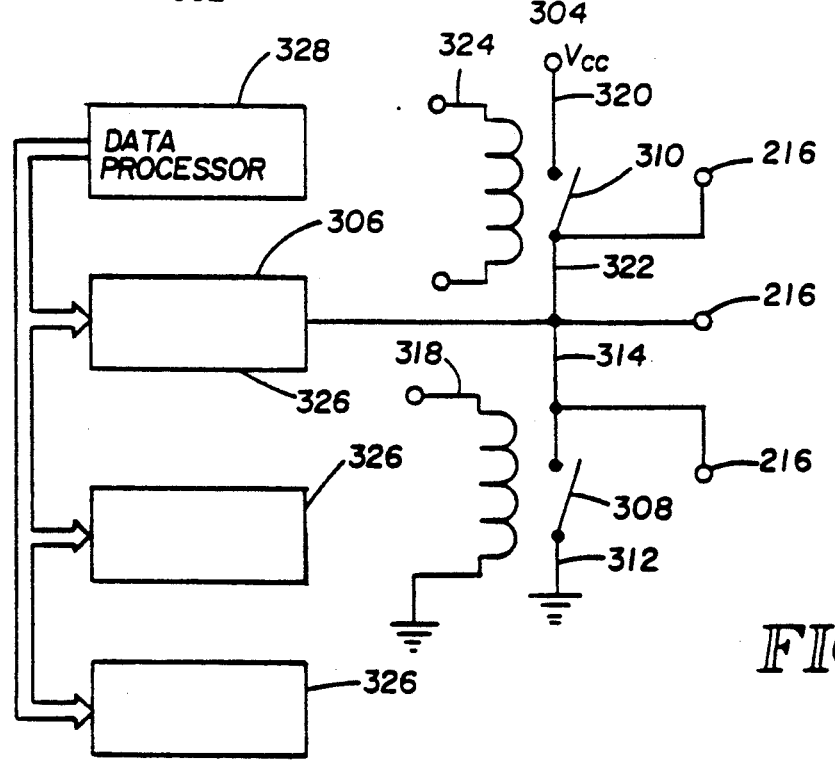
FIG. 4 is a block diagram of the semiconductor programmer of FIG. 1.

An illustrative block diagram of the plurality of relays 304 is provided in FIG. 4. Therein, a pin driver unit 306 is coupled to first and second relays 308 and 310. The first relay 308 includes a first lead 312 coupled to a reference potential and a second lead 314 coupled to a compliant pin contact 216. The first relay 308 is responsive to a control signal supplied to a control lead 318 for coupling the compliant pin contact 216 to the reference potential via the first lead 312. Similarly, the second relay 310 includes a first lead 320 coupled to a source of voltage and a second lead 322 coupled to the compliant pin contact 216. The second relay 310 is responsive to a control signal supplied to its control lead 324 for coupling the compliant pin contact 216 to the source of voltage via the first lead 320. Accordingly, the compliant pin contact 216 may be selectively coupled to: a source of electrical voltage to be provided to the semiconductor circuit to be programmed; a reference potential to be provided to the semiconductor circuit to be programmed; and/or a pin driver unit 306.

As is known in the art, the pin driver unit 306 is responsive to computer control for providing voltage and current signals necessary for programming the semiconductor circuit. In the presently preferred embodiment of the invention, a plurality of pin driver units 326 are responsive to control signals received from data processing circuitry 328 for providing voltage and current signals necessary for programming or testing a plurality of semiconductor circuits. The electrical signals applied to each pin of a semiconductor circuit perform a specific function. Predetermined voltage and current signals must therefore be applied to the separate pins, according to the function performed by the pin, during a test or programming procedure. Each of the pin driver units 326 may be programmed by the data processing circuitry 328 to correspond to one of the plurality of functions typically performed by the signals applied to a pin of a semiconductor circuit so that each compliant pin may be selectively used to mate with different pins of different semiconductor circuits.

As an example, an erasable programmable read only memory (EPROM) device may have a plurality of pins numbered from 1 to 14 wherein: pin no. 1 is constructed for receiving a signal for supplying the source voltage to the semiconductor circuit; pins nos. 2-5 may be constructed for receiving signals for addressing the separate memory locations of the erasable programmable read only memory device; pins nos. 7-9 may be constructed for receiving the data to be stored in or read out of the erasable programmable read only memory device; pins nos. 10-13 may be constructed for receiving signals associated with control and timing of the erasable programmable read only memory device; and pin no. 14 may be constructed for receiving a signal as the reference voltage for the erasable programmable read only memory device. As mentioned above, a semiconductor carrier 200 may be provided for receiving the erasable programmable read only memory device and, when coupled to the compression coupler 204, will transform the size, shape, and pin construction of the erasable programmable read only memory device to the size, shape, and board contact construction of the compression coupler 204. The board contacts of the compression coupler 204 will mate with the conductors 213 of the compliant pin assembly 212 which in turn mate with the compliant pin contacts 216 of the relay board 106. Since each compliant pin contact 216 may be selectively controlled to provide signals representing any of the aforementioned functions, the programmer need only determine which compliant pin contact corresponds to which leads of the erasable programmable read only memory device. Thereafter, the pin driver unit 326 that supplies the signal to the identified compliant pin contact 216 will be programmed to perform that function. In this manner, the semiconductor programmer 100 may be used to program semiconductor circuits having differing pin assignments, e.g., a semiconductor circuit wherein pin no. 1 is identified as performing an addressing function.

It will be apparent to those skilled in the art that although the compliant pin contact 216 is illustrated in FIG. 4 as being coupled to a pin driver unit 306, only a portion of the compliant pin contacts 216 (FIG. 2) are coupled to a pin driver unit. Also, although the compliant pin contact 216 is shown to be selectively coupleable to both a source of electrical voltage and a reference potential, a first portion of the compliant pin contacts 216 (FIG. 2) may be coupleable to only a source of electrical voltage; a second portion of the plurality of compliant pin contacts 216 may be selectively coupleable to only a reference potential; and a third portion of the plurality of compliant pin contacts 216 may be selectively coupleable to a pin driver unit 326. Many other combinations for coupling the compliant pin contacts 216 to control voltages and currents will readily become apparent to those skilled in the art.

The plurality of compliant pin contacts 216 are provided for transmitting programming voltages and currents from the semiconductor programmer 100 to the semiconductor circuit 202 via a contact board assembly 210 and the compression coupler 204. As mentioned above, the contact board assembly 210 includes a compliant pin assembly that is securely mounted to the relay board 106 through the exterior surface 103 of the housing 102. With reference to FIG. 5, the compliant pin assembly 212 includes first and second surface portions 400 and 402, each including a plurality of mating through holes 404 for securely coupling the compliant pin assembly 212 to the relay board 106. When joined together, the first surface portion 400 and the second surface portion 402 combine to define a guide channel 218 (best illustrated in FIG. 2).

A plurality of mating compliant pin through holes 406 are provided in the first surface portion 400 and second surface portion 402 of the compliant pin assembly 212. When assembled, the compliant pin through holes 406 of the first surface portion 400 and the second surface portion 402 mate to define a plurality of substantially cylindrical compliant pin chambers 403 (FIG. 5B) for receiving a plurality of respective compliant pins 408. Each compliant pin chamber 403 includes first and second rims 410 and 412 (FIG. 5B) positioned respectively at the first surface portion 400 and second surface portion 402. The first and second rims 410 and 412 project inwardly of the compliant pin chambers 403 for engaging the plurality of compliant pins 408 to position the compliant pins within the compliant pin chambers 403.

Each of the plurality of compliant pins 408 comprises a substantially electrically conductive pin having first and second generally cylindrical ends 414 and 416, respectively. The first end 414 and second end 416 of the plurality of compliant pins 408 is each sized to extend outward beyond the rims 410 and 412 of the compliant pin chambers 403. Each of the plurality of compliant pins 408 also includes an intermediate portion 418 which is sized to be retained intermediate the rims 410 and 412 of the plurality of compliant pin chambers 403. The intermediate portion 418 includes a plurality of springs 420 which are constructed for mating with a spring biasing portion 422, thereby to bias the first end 414 away from the second end 416 of the compliant pins 408. Accordingly, the plurality of compliant pins 408 are springably mounted within the compliant pin assembly 212, and extend outward beyond the first surface portion 400 thereof, to define the plurality of conductors 213. It will be apparent to those skilled in the art that although the invention is described herein by reference to the compliant pins 408, any electrically conductive pin constructed to be spring biased in along the cylindrical axis.

The compression handle 214 (FIG. 2) includes a plurality of guide rails 220 that are positioned to mate with the guide channels 218 of the compliant pin assembly 212 so that the compression handle 214 may be slidably mounted to the compliant pin assembly 212. The compression handle 214 further includes a rearward end 222 and a forward end 224 wherein the forward end 224 is positioned opposite the rearward end 220. First and second sides 226 and 228, respectively, join the rearward end 220 with the forward end 224. The plurality of guide rails 220 are mounted to the first and second sides 226 and 228 of the compression handle 214. A first hand grip 230 is integral with the compression handle 214 and positioned at the forward end 224 thereof. The first hand grip 230 is sized for enabling a user to slide the compression handle 214 along the compliant pin assembly 212. A plurality of compression flanges 232 are mounted to the first and second sides 226 and 228, respectively, of the compression handle 214 and positioned to be spaced from the first surface portion 400 of the compliant pin assembly 212. Each of the plurality of compression flanges 232 includes a tapered end portion 234 that is positioned proximate the rearward end 220 of the compression handle 214. As will be described in more detail below, the compression flanges 232 are provided for compressively coupling the compression coupler 204 to the compliant pin assembly 212 to thereby make electrical contact between the compression coupler 204 and the plurality of compliant pins 408 mounted in the compliant pin assembly 212.

The plurality of compliant pin through holes 406 are positioned in the compliant pin assembly 212 and arranged in the predetermined board contact pattern of the compression coupler 204 so that the plurality of compliant pins 408 will make electrical contact with the plurality of compliant pin contacts 216 mounted upon the relay board 106. Accordingly, the pin driver unit 306, voltage supply, and reference potential illustrated diagrammatically in FIG. 4 are selectively coupled to the compliant pins 408 via the compliant pin contacts 216. As mentioned above by reference to FIG. 4, a first portion of the compliant pin contacts 216, and hence a first portion of the conductors 213, may be selectively coupleable to a source of electrical voltage; a second portion of the plurality of compliant pin contacts 216, and hence a second portion of the plurality of conductors 213, may be selectively coupleable to a reference potential, and a third portion of the plurality of compliant pin contacts 216, and hence a third portion of the plurality of conductors 213, may be selectively coupleable to a pin driver unit 326.

The compression coupler 204 includes a compression ring 500 (FIG. 6) securely coupled to a printed circuit board 502. The compression ring 500 receives the semiconductor circuit 202 mounted in the semiconductor carrier 200. The compression ring 500 includes a rearward end 504 positioned opposite a forward end 506 and having first and second sides 508 and 510, respectively, positioned intermediate the rearward end 504 and the forward end 506. A plurality of engaging flanges 512 are positioned along the first and second sides 508 and 510 of the compression ring 500. Each engaging flange 512 includes a tapered end portion 514 which is constructed to mate with the tapered end portion 234 of the compression flanges 232 secured to the compression handle 214 (FIG. 2). The compression ring 500 is positioned within the compression handle 214 to abut the first surface portion of the compliant pin assembly 212. The compression handle 214 slides along the guide channel 218 of the compliant pin assembly 212 so that the compression flanges 232 engage the engaging flanges 512 and thereby compress the compression coupler 204 to the compliant pin assembly 212.

The compression coupler 204 also includes a second hand grip 516 integral with the compression ring 500 and positioned on the forward end 506 thereof. The second hand grip 516 is provided for enabling a user to grip and hold the compression coupler 204 to slide the compression handle 214 along the compliant pin assembly 212 and compress the compression coupler 204 to the compliant pin assembly 212.

Figure 6:
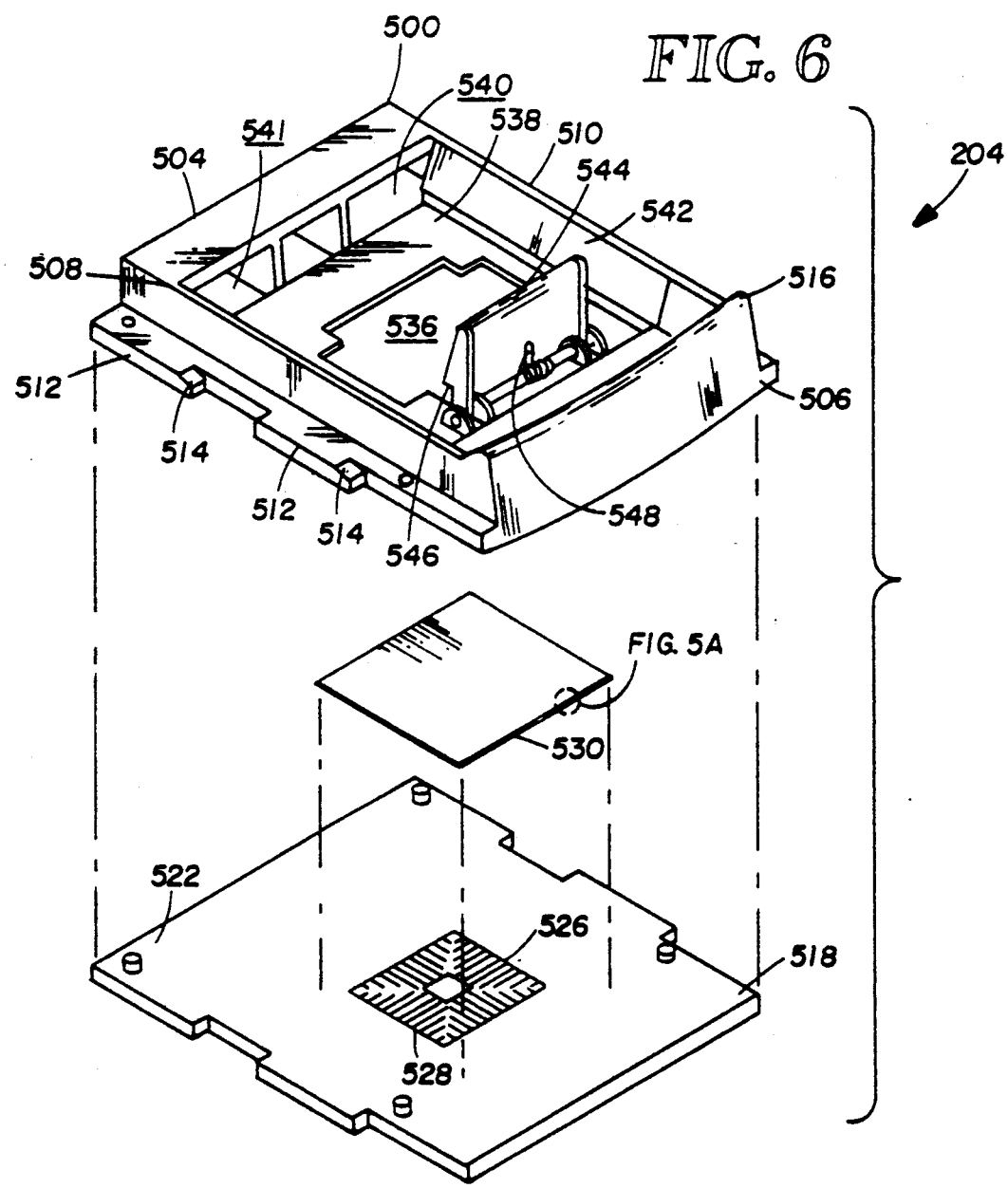
FIG. 6 is an exploded isometric view of the compression coupler illustrated in FIG. 2.

A printed circuit board 518 is secured to the compression ring 500. The printed circuit board 518 transforms the varying pin constructions of a plurality of semiconductor circuits to the predetermined board contact pattern of the compression coupler 204 to make electrical contact between the semiconductor circuit 202 and the semiconductor programmer 100. The printed circuit board includes a first side 520 (FIG. 6B) and a second side 522 opposite the first side 520. The first side 520 includes a plurality of board contacts 524 that are arranged in the predetermined board contact pattern to mate with the plurality of conductors 213 of the compliant pin assembly 212. The second side 522 of the printed circuit board 518 includes a lead pattern 526. In the presently preferred embodiment of the invention, the lead pattern comprises a gold pattern etched upon the second side 522 of the printed circuit board 518.

Figure 6A:
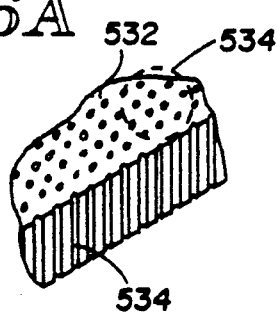
FIG. 6A is a partial, sectional, isometric view of the elastomeric pad illustrated in FIG. 6.
Figure 6B:
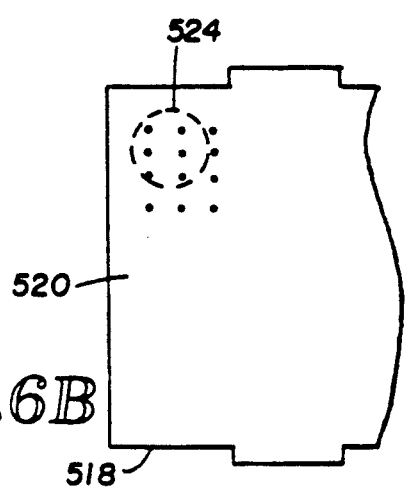
FIG. 6B is a plan view of the printed circuit board illustrated in FIG. 6.

The lead pattern 526 includes four sides each including a plurality of substantially parallel leads 528. The four sides are etched in a generally rectangular configuration with the substantially parallel leads 528 of adjacent sides having a generally orthogonal relationship. Each one of the four sides of the lead pattern 526 includes a first end, a second end, and an intermediate portion wherein the substantially parallel leads 528 etched on the intermediate portion of each of the four sides extends inwardly of the lead pattern 526 farther than the substantially parallel lead at the first and second end as illustrated in FIG. 6A. The lead pattern 526 illustrated in FIG. 6A is particularly adapted for making electrical contact with a semiconductor circuit 202 having a square shape. Further, the lead pattern 526 is suitable for making electrical contact with semiconductor circuit packages having a generally rectangular shape and sides that may vary over a range approximately equal to the length of the substantially parallel leads 528 positioned at the intermediate portion of a side of the lead pattern 526. A lead pattern is constructed interior of the printed circuit board 518, using conventional techniques, to individually couple the plurality of leads 528 to separate ones of the plurality of board contacts 524. In this manner, the plurality of leads 528 may be coupled to respective ones of the plurality of conductors 213, and hence coupled to respective ones of the plurality of compliant pin contacts 216, so that: a first portion of the plurality of leads 528 may be selectively coupleable to a source of voltage; a second portion of the plurality of leads 528 may be selectively coupleable to a reference potential; and a third portion of the plurality of leads may be selectively coupleable to a pin driver unit 306.

An elastomeric pad 530 is mounted upon the lead pattern 526 for coupling the leads of the semiconductor circuit 202 to the lead pattern 526. The elastomeric pad 530 comprises an elastomer 532 (FIG. 6A) having a plurality of embedded wires 534. The combination of the plurality of wires and the elastomer provides an elastic coupler that allows conduction from one side to the opposing side in the transverse direction. The elastomeric pad 530 causes the leads of the semiconductor circuit 202 to resiliently contact the lead pattern 526, to conduct voltage and current signals between the lead pattern and the leads of the semiconductor circuit.

The compression ring 500 includes a carrier registration through hole 536 for receiving the semiconductor carrier 200. The carrier registration through hole 536 is positioned proximate the elastomeric pad 530 of the compression ring 500 and extends through the compression ring so that the elastomeric pad 530 is accessible to a user. The carrier registration through hole 536 further includes a recessed portion for registering the semiconductor carrier 200 with respect to the elastomeric pad 530, as will be discussed in more detail below. The compression ring also includes a receiving collar 538 positioned along the rearward end 504 of the compression ring 500. The receiving collar 538 has first and second receiving chambers 540 and 541 constructed for positioning the semiconductor carrier 200 within the carrier registration through hole 536. A securing clip 542 is rotatably mounted to the compression ring 500 intermediate the forward end 506 and the carrier registration through hole 536. The securing clip 542 includes a gripping end 544 and an engagement end 546 wherein the engagement end 546 is positioned opposite the gripping end 544 and proximate the carrier registration through hole 536. A spring 548 is mounted to the securing clip 542 for biasing the gripping end 544 of the securing clip toward the rearward end 504 of the compression ring 500.

The semiconductor carrier 200 (FIG. 2) is received within the receiving collar 538 of the compression coupler 204 and secured to the compression coupler 204 by the securing clip 542 so that the leads of the semiconductor circuit 202 are proximate the elastomeric pad 530. The semiconductor carrier 200 includes a bottom portion 236 having a semiconductor through hole 238, FIG. 7. A first side 600 of the semiconductor carrier 200 includes a boss 602 positioned about the semiconductor through hole 238 and mating with the recess of the carrier registration through hole 536 to position the semiconductor carrier 200 with respect to the elastomeric pad 530. The semiconductor carrier 200 further includes a top portion 240. The bottom portion 236 and top portion 240 each include hinged portions that mate to define first and second hinges 604 and 606, respectively, for pivotally mounting the top portion 240 to the bottom portion 236. The first and second hinges 604 and 606 are positioned interior of the first and second receiving chambers 540 and 541, respectively, of the receiving collar 538. The top portion 240 includes a retention groove 608 (FIG. 7C) mating with the engagement end 546 of the securing clip 542 (FIG. 6).

In operation, a semiconductor circuit 202 is positioned within the semiconductor through hole 238 of the semiconductor carrier 200, and the top portion 240 rotated toward the bottom portion 236 to engage the semiconductor circuit 202. The semiconductor carrier 200 is positioned within the compression coupler 204 with the first and second hinges 604 and 606 positioned interior of the first and second receiving chambers 540 and 541, respectively. The securing clip is biased toward the retention groove 608 such that the engagement end 546 engages the retention groove 608 and secures the semiconductor carrier 200 to the compression coupler 204. It will be apparent to those skilled in the art that the semiconductor carrier 200 is preferably provided having a predetermined size and shape for mating with the compression coupler 204. However, the semiconductor through hole 238 of the semiconductor carrier 200 may be of varying size and shape to accommodate the varying size and shape of a plurality of semiconductor circuits. Accordingly, the semiconductor carrier 200 transforms the varying size and shape of a plurality of semiconductor circuits 202 to a predetermined size and shape of the semiconductor carrier 200 so that a plurality of semiconductor circuits 202 may be physically coupled to the compression coupler 204.

The semiconductor carrier 200 further includes a compression pad 240 mounted on the top portion 240 and positioned to be proximate the semiconductor circuit 202 when the semiconductor carrier 200 is mounted within the compression coupler 204. The compression pad 242 engages the semiconductor circuit 202 and compresses the leads of the semiconductor circuit to the elastomeric pad 530 of the compression coupler 204. As illustrated in FIG. 2, the compression pad 242 comprises a generally rectangular resilient pad for engaging the semiconductor circuit 202 to urge the semiconductor circuit toward the elastomeric pad 530 when the semiconductor circuit is positioned within the semiconductor through hole 238 of the semiconductor carrier 200. This construction for a compression pad is particularly suited for the semiconductor circuit 202 of the type having leads which extend outward laterally from the package, and downward to curl under the semiconductor package. By urging the entire package downward toward the elastomeric pad 530, the leads of the semiconductor circuit are urged toward the transverse conducting wires 534 to make electrical contact between the leads of the semiconductor circuit and the lead pattern 526.

As mentioned above, the data processor 328 of the semiconductor programmer 100 is capable of programming the plurality of pin driver units 306 so that each unit may provide electrical signals corresponding to a particular function of the semiconductor circuit 202. As further discussed above, a third portion of the plurality of compliant pin contacts 216 are coupled to the pin driver units 306 so that the pin driver units 306 are in turn coupled to the plurality of leads 528 of the lead pattern 526. When mounted in the semiconductor carrier 200, so that the leads of the semiconductor circuit 202 engage the elastomeric pad 530 and make electrical contact with the plurality of leads 528 of the lead pattern 526, the leads of the semiconductor circuit 202 are coupled to the pin driver units 306. The pin driver units 306 may then be programmed to provide signals corresponding to the function performed by the leads to which respective ones are connected. Further, when mounted to the compression coupler 204, a first portion of the leads of the semiconductor circuit 202 are selectively coupleable to a voltage source and a second portion of the leads are selectively coupleable to a reference potential for providing the source voltage necessary for operation and programming of the semiconductor circuit 202. Accordingly, a plurality of semiconductor carriers 200 may cooperate with the compression coupler 204 and the contact board assembly 210 to transform the varying size, shape, and pin constructions of a variety of semiconductor circuits to a standard size, shape, and pin construction for programming by the semiconductor programmer 100.

It will be apparent to those skilled in the art that a single compression coupler 204 may be provided for accommodating a wide variety of semiconductor circuits wherein the semiconductor circuit has a generally rectangular shape and the sides of the semiconductor circuit are substantially equal in length. Although a plurality of semiconductor carriers 200 will be required for each package size of semiconductor circuits 202, those skilled in the art will recognize that the semiconductor carriers may be manufactured inexpensively. Further, to accommodate semiconductor circuit shapes other than those discussed above, separate compression couplers 204 may be provided. It will further be apparent to those skilled in the art that it is much more convenient and efficient to provide compression couplers 204 to secure the plurality of semiconductor circuits to the semiconductor programmer 100 as opposed to providing a plurality of sockets on the semiconductor programmer 100. This is because a particular user may not require apparatus that accommodates all of the variety of packages currently available. Accordingly, should that particular user be required to purchase a semiconductor programmer having a plurality of sockets, each of a unique construction for each unique package construction of semiconductor circuits available, any semiconductor circuit constructions which that particular programmer does not need becomes unnecessary overhead and expense with respect to his purchase of the semiconductor programmer 100.

Figure 8:
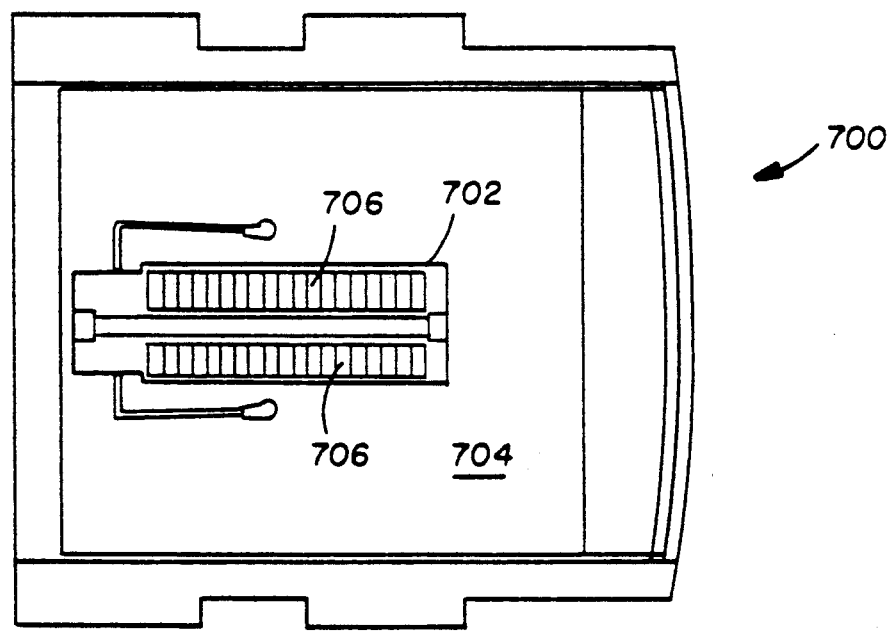
FIG. 8 is a plan view of an alternative compression coupler for use with the subject invention.

An alternative configuration for a compression coupler 204 is provided in FIG. 8. A compression coupler 700 includes a dual in-line package (DIP) socket 702 mounted thereon. The compression coupler 700 is of the same size and shape as the compression coupler 204, thereby constructed to mate with the contact board assembly 210. Further, the compression coupler 700 includes a printed circuit board having a plurality of board contacts arranged on a first side thereof in the predetermined board contact pattern to mate with the plurality of conductors 213 of the compliant pin assembly 212. The printed circuit board 704 of the compression coupler 700 includes a lead pattern integral therewith for coupling each of the plurality of lead sockets 706 to predetermined ones of the plurality of board contacts so that the plurality of lead sockets 706 are each coupled to respective ones of the plurality of pin driver units 306. Accordingly, dual in-line packages of varying size may be received within the compression coupler 700 and coupled to the contact board assembly 210 of the semiconductor programmer 100. It will become apparent to those skilled in the art that other compression couplers 204 may be provided for receiving semiconductor circuits of various configurations.

Figure 7B:
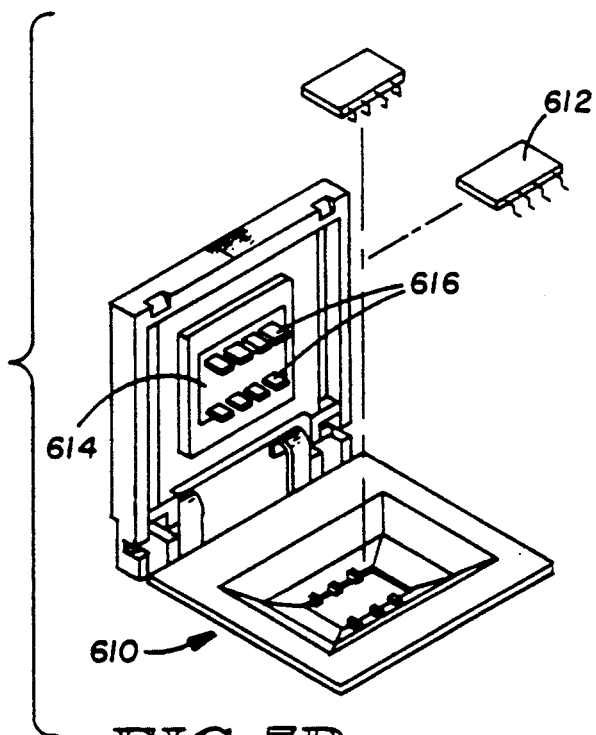
FIG. 7B is an isometric view of an alternative semiconductor carrier for use with the subject invention.
Figure 7C:
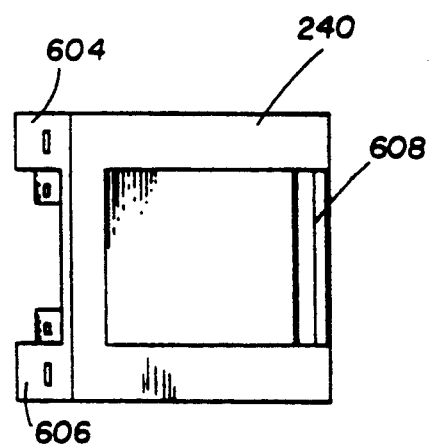
FIG. 7C is a bottom plan view of the semiconductor carrier illustrated in FIG. 2.

An alternative semiconductor carrier 610 is illustrated in FIG. 7B. The semiconductor carrier 610 is constructed for receiving a semiconductor circuit 612 of the type having leads which extend laterally outward from the semiconductor package downward transverse to the semiconductor package and outward in a dog leg configuration. The semiconductor carrier 610 includes a compression pad 614 having a plurality of compression arms 616 extending outward therefrom. The plurality of compression arms are constructed to engage the leads of the semiconductor circuit 612 to compress the leads of the semiconductor circuit to the elastomeric pad 530.

It will be apparent to those skilled in the art that although only several presently preferred embodiments of the invention have been described in detail herein, many modifications and variations may be provided without departing from the true scope and spirit of the invention. Accordingly, the invention is not limited except as by the appended claims.

We claim:

1. An electronic device constructed for selective coupling to a plurality of semiconductor circuits wherein each of the plurality of semiconductor circuits has a unique package construction, and wherein each of the plurality of semiconductor circuits includes a plurality of leads, said electronic device comprising:

a housing;

a relay board having first and second sides and being secured interior of said housing, said relay board including a plurality of relays mounted on said first side thereof, each having first and second leads and being responsive to a control signal for coupling said first lead to said second lead, a first portion of said plurality of relays having said first lead coupled to a source of voltage and a second portion of said plurality of relays having said first lead coupled to a reference potential, said relay board further including a plurality of compliant pin contacts each being substantially electrically conducting, each of said plurality of compliant pin contacts having first and second opposing ends, said plurality of compliant pin contacts being positioned to extend through said relay board from said first side to said second side so that said first ends of said plurality of compliant pin contacts are positioned on said first side of said relay board and so that said second ends of said plurality of compliant pin contacts are positioned on said second side of said relay board, a relay portion of said plurality of compliant pin contacts having said first end electrically coupled to respective ones of said second leads of said plurality of relays;

a generally rectangular compliant pin assembly having first and second surfaces, said compliant pin assembly including a plurality of through holes extending therethrough, each of said plurality of through holes comprising a substantially cylindrical chamber having first and second rims positioned respectively at said first and second surfaces of said compliant pin assembly, each of said first and second rims projecting inwardly of said through holes substantially parallel to said first and second surfaces, thereby to define a plurality of compliant pin chambers, said compliant pin assembly further including first and second guide channels positioned at opposite sides of said compliant pin assembly;

a plurality of compliant pins each being substantially electrically conductive, said plurality of compliant pins each being seated within a respective one of said plurality of compliant pin chambers, each said compliant pin including first and second generally cylindrical ends and an intermediate portion, each of said first and second ends of said plurality of compliant pins being sized to extend outward from said compliant pin assembly beyond said first and second rims of said plurality of through holes, said intermediate portion of said plurality of compliant pins being sized to retain said plurality of compliant pins within said plurality of compliant pin chambers, each of said plurality of compliant pins further including spring means for biasing said first end away from said second end, said compliant pin assembly being secured to said relay board so that said first surface of said compliant pin assembly faces outwardly of said housing and so that a preselected portion of said plurality of compliant pins are in electrical contact with a preselected portion of said plurality of compliant pin contacts;

a generally rectangular compression handle having first and second opposing sides, a forward end and a rearward end, that define a generally rectangular compression chamber, said compression handle including first and second guide rails projecting inwardly of said first and second opposing sides, said first and second guide rails being slidably coupled to said first and second guide channels thereby to slidably couple said compression handle to said compliant pin assembly, a first hand grip being positioned at said forward end of said compression handle for enabling a user to slide said compression handle along said compliant pin assembly, said compression handle further including first and second compression flanges projecting inwardly of said first and second sides thereof and adapted to be spaced from said first surface of said compliant pin assembly, each said first and second compression flange having a first tapered end portion positioned proximate said rearward end of said compression handle;

a generally rectangular compression ring sized to be removably positioned in said compression chamber, said compression ring having first and second opposing sides, a forward end, a rearward end, a semiconductor side and a compliant pin assembly side, a printed circuit board having first and second sides being mounted on said compliant pin assembly side of said compression ring with said first side of said printed circuit board facing outward of said compression ring, said printed circuit board including a plurality of substantially electrically conducting board contacts positioned on said first side thereof and adapted to mate with a selected portion of said compliant pins, said compression ring further including first and second engaging flanges positioned at said first and second sides of said compression ring each having a tapered end portion proximate said forward end portion of said compression ring for engaging said first and second compression flanges of said compression handle thereby to compress said compression ring to said compliant pin assembly and electrically couple said board contacts with said selected portion of said compliant pins, said compression ring further including a second hand grip positioned at said forward end of said compression ring for enabling a user to grip said first and second hand grips to slide said compression handle along said compliant pin assembly, thereby to compress said compression ring to said compliant pin assembly, said compression ring further including connector means for receiving a semiconductor circuit, said connector means having a plurality of electrical conductors constructed for electrical contact with the leads of the semiconductor circuit, said plurality of electrical conductors being electrically coupled to said plurality of board contacts, said printed circuit board including a plurality of registration through holes extending from said first side to said second side thereof;

a plurality of registration pins mounted to said compliant pin assembly for engaging said registration through holes of said compression ring to align said compression ring with said compliant pin assembly to ensure alignment of said board contacts with said selected plurality of said compliant pins;

a plurality of pin driver means coupled for providing electrical voltages and currents to a third portion of said compliant pin contacts mounted to said relay board wherein the electrical voltages and currents are provided for programming the semiconductor circuit mounted in said connector means of said compression ring; and data processing means for providing said control signals to said first and second portion of said plurality of relays to couple selected ones of said compliant pin contacts to said source of voltage and selected ones of said compliant pin contacts to said reference potential, said data processing means being further constructed for providing structure and program data and signals to said plurality of pin driver means for controlling said pin driver means for programming of the semiconductor circuit mounted in said connector means of said compression ring.

2. The electronic device as recited in claim 1 wherein said connector means comprises a dual in-line package (DIP) socket for receiving semiconductor circuits having a standard dual in-line package construction.

3. The electronic device as recited in claim 1 wherein said connector means comprises:
- a lead pattern etched upon said second side of said printed circuit board, said lead pattern including four sides wherein each one of said four sides includes a plurality of substantially parallel leads, said four sides being etched in a generally rectangular configuration with said substantially parallel leads of adjacent sides having a generally orthogonal relationship, each one of said four sides further including first and second ends and an intermediate portion wherein said substantially parallel leads etched on said intermediate portion of each of said four sides extend inwardly of said lead pattern farther than said substantially parallel leads at said first and second ends, said substantially parallel leads of said lead pattern being electrically coupled to said board contacts;
- an elastomeric pad having first and second sides, said elastomeric pad being mounted to said printed circuit board with said first side thereof proximate said lead pattern, said elastomeric pad including a plurality of wires extending from said first side to said second side for conducting electricity from said second side to said lead pattern;
- a registration through hole extending from said semiconductor side of said compression ring to said compliant pin assembly side thereof, a recess in said semiconductor side of said compression being constructed about the periphery of said registration through hole;
- a receving collar positioned on said semiconductor side of said compression ring intermediate said rearward end and said recess about the periphery of said registration through hole, said receiving collar having a receiving chamber positioned with a receiving chamber opening facing said forward end of said compression ring; and
- a securing clip mounted to said semiconductor side of said compression ring intermediate said recess about the periphery of said registration through hole and said forward end of said compression ring, said securing clip including an engagement end positioned proximate said registration through hole and a gripping end positioned remote of said registration through hole, said securing clip being mounted to pivot about an axis extending from said first side to said second side of said compression ring and including a spring biasing said engagement end proximate said semiconductor side of said compression ring and biasing said gripping end remote from said semiconductor side.

4. The electronic device as recited in claim 3. further comprising a semiconductor carrier for mounting a semiconductor circuit to said compression ring, said semiconductor carrier comprising:
- a bottom portion having first and second sides and a semiconductor through hole extending from said first side to said second side, said semiconductor carrier being adapted to be coupled to said compression ring with said first side proximate said compression ring, said first side including a boss about said semiconductor through hole adapted to mate with said recess of said compression ring thereby to register said semiconductor carrier with said compression ring, a first hinge portion being mounted to said bottom portion; and
- a top portion having first and second sides, a second hinge portion adapted to mate with said first hinge portion and being rotatably mounted thereto by a hinge pin thereby rotatably mounting said top portion to said bottom portion with said first side of said top portion proximate said second side of said bottom portion, said top portion having a compression pad mounted to said first side thereof and positioned to be proximate said semiconductor through hole for compressing a semiconductor circuit positioned therein against said elastomeric pad of said compression ring thereby to make electrical contact between the leads of the semiconductor circuit and said plurality of wires of said elastomeric pad, said top portion further including a retention groove on said first side opposite said second hinge portion and constructed to mate with said engagement end of said securing clip, said first and second hinge portions being constructed to mate with said receiving chamber of said compressing ring so that said semiconductor carrier may be rotated into engagement with said compression ring and secured therein by said securing clip.

5. An electronic device constructed for selective coupling to a plurality of semiconductor circuits wherein each of the plurality of semi conductor circuits has a unique circuit package construction and wherein each of the plurality of semiconductor circuits includes a plurality of leads, said electronic device comprising:
- a housing;
- electronic circuit means for generating voltage and current signals to be provided to the semiconductor circuit;
- compression coupling means for receiving the semiconductor circuit, said compression coupling means including printed circuit board means having first and second sides and constructed for removably mounting the semiconductor circuit on a first side of said printed circuit board means, said printed circuit board means including a first plurality of conductor means for coupling to the leads of the semiconductor circuit, said first plurality of conductor means including a plurality of contacts positioned on said second side of said printed circuit board means opposite said first side; and
- contact board means for removably receiving said compression coupling means, said contact board means being fixed to said housing and including a second plurality of conductor means for transmitting voltages and currents between said electronic circuit means and a selective portion of said plurality of contact of said compression coupling means, said contact board means further including first and second guide channels positioned at opposite sides thereof, said compression means comprising handle means for compressing said compression coupling mean to said contact board means, said handle means including first and second guide rail slideably coupled to said first and second guide channels thereby to slideably couple said handle means to said contact board means, said handle means also including flange means for engaging said compression coupling means for compression said compression coupling means to said contact board means, and first hand grip means mounted to said handle means for enabling a user to slide said handle means along said contact board means.

6. The electronic device as recited in claim 5, further comprising elastic coupling means mounted to said printed circuit board proximate said lead pattern for springable and electrical engagement with the leads of the semiconductor circuit thereby to conduct voltage and current signals between said lead pattern and the leads of the semiconductor circuit.

7. The electronic device as recited in claim 6, further comprising compressing means for compressing the semiconductor circuit to said elastic coupling means of said compression coupling means, said elastic coupling means providing compensation for any lack of coplanarity in said lead pattern and the leads of the semiconductor circuit.

8. The electronic device as recited in claim 7 wherein said compressing means comprises semiconductor carrier means for receiving the semiconductor circuit, said semiconductor carrier means including a compression pad adapted to engage the semiconductor circuit for compressing the leads of the semiconductor circuit to said elastic coupling means, said compression coupling means including means for receiving said semiconductor carrier means and for compressing said semiconductor carrier means to said printed circuit board so that said compression pad engages the semiconductor circuit and compresses the leads of the semiconductor circuit to said elastic coupling means.

9. The electronic device as recited in claim 8, further comprising registration means for positioning said semiconductor carrier means with respect to said compression coupling means so that the leads thereof are in registration with the leads of said lead pattern.

10. The electronic device as recited in claim 9, further comprising a plurality of semiconductor carrier means each being constructed to carry semiconductor circuits having a unique package configuration wherein each of said plurality of semiconductor carrier means is compressibly engagable with said compression coupling means.

11. The electronic device as recited in claim 5, wherein said compression coupling means comprises a dual in-line package (DIP) socket mounted to said first side of said printed circuit board means for receiving semiconductor circuits having a standard dual in-line package construction.

12. The electronic device as recited in claim 5 wherein said contact board means includes a compression surface and wherein said second plurality of conductor means comprises resilient coupling means positioned proximate said compression surface for springable and electrical engagement with said plurality of contacts of said compression coupling means thereby to conduct voltage and current signals between said compression coupling means and said contact board means.

13. The electronic device as recited in claim 12 wherein said contact board means includes a control surface opposite said compression surface and wherein said resilient coupling means further comprises means for conducting voltage and current signals through said contact board means in a direction substantially normal to said compression and control surfaces.

14. The electronic device as recited in claim 13 wherein said resilient coupling means comprises compliant pin means for engaging said plurality of contacts of said compression coupling means and making electrical contact therebetween, said plurality of compliant pin means being slidably mounted to said contact board means for reciprocal motion in a direction normal to said compression surface, said plurality of compliant pin means being biased outward from said compression surface.

15. The electronic device as recited in claim 12, further comprising compression means for engaging said compression coupling means and for compressing said compression coupling means to said compression surface of said contact board means so that said resilient coupling means mechanically and electrically engage said plurality of contacts of said compression coupling means.

16. The electronic device as recited in claim 15 wherein said compression means includes means for providing a compression force to said compression coupling means and wherein said compression force is applied in a direction substantially normal to said compression surface of said contact board means.

17. The electronic device as recited in claim 5 wherein said compression coupling means further comprises mating flange means for engaging said flange means of said contact board means thereby to compress said compression coupling means to said contact board means and second hand grip means for enabling a user to grip said first and second hand grip means to slide said handle means along said contact board means.

18. The electronic device as recited in claim 5, further comprising registration means for positioning said compression coupling means with respect to said contact board means so that said plurality of contacts of said compression coupling means make electrical contact with said coupling means of said contact board means.

19. A compression coupler for removably coupling a plurality of semiconductor circuits to an electronic device wherein the electronic device includes a plurality of conductors for transmitting voltage and current signal to and from the electronic device and wherein the plurality of semiconductor circuits are of differing configurations and each include a plurality of leads, said compression coupler comprising:

circuit board means for physically and electrically interfacing the plurality of semiconductor circuits with the electronic device, said circuit board means having first and second sides, said first side including connector means for removably receiving the plurality of semiconductor circuits;

a plurality of contacts mounted to said circuit board means and positioned for making electrical contact with the plurality of conductors of the electronic device; and a plurality of conductor means for electrically coupling the leads of the semiconductor circuits with said plurality of contacts, said plurality of conductor means including a lead pattern positioned on said first side of said circuit board means, said lead pattern including four sides wherein each one of said four sides includes a plurality of substantially parallel leads, said four sides being positioned in a generally rectangular configuration with said substantially parallel leads of adjacent sides having a generally orthogonal relationship, each of said four sides further including first and second ends and an intermediate portion wherein said substantially parallel leads etched on said intermediate portion of each one of said four sides extends inwardly of said lead pattern farther than said substantially parallel leads at said first and second ends so that said plurality of leads will electrically mate with the plurality of leads of the plurality of semiconductor circuits, said substantially parallel leads of said lead pattern being electrically coupled to said plurality of contacts for electrically coupling the leads of the semiconductor circuits with the electronic device.

20. The compression coupler as recited in claim 19 wherein said connector means comprises a dual in-line package (DIP) socket mounted to said first side of said printed circuit board means for receiving semiconductor circuits having a standard dual in-line package construction.

21. The compression coupler as recited in claim 20, further comprising elastic coupling means mounted for providing springable and electrical engagement between the leads of the semiconductor circuit and said plurality of conductor means thereby to conduct voltage and current signals between the plurality of conductors of the contact board and the leads of the semiconductor circuit.

22. The compression coupler as recited in claim 21, further comprising compressing means for compressing the semiconductor circuit to said elastic coupling means of said compression coupling means.

23. The compression coupler as recited in claim 22 wherein said plurality of coupling means further comprises a lead pattern etched to said first side of said printed circuit board said lead pattern including a plurality of leads configured to electrically mate with the leads of a plurality of semiconductor circuits wherein the plurality of semiconductor circuits have differing package configurations, said elastic coupling means being positioned proximate said lead pattern to conduct voltage and current signals between the leads of the semiconductor circuit and said lead pattern.

24. A modular socket apparatus for removably coupling a plurality of semiconductor circuits to an electronic device wherein the plurality of semiconductor circuits have differing package constructions and wherein each of the plurality of semiconductor circuits includes a plurality of leads, the electronic device for providing at least first and second electrical signals to the plurality of semiconductor circuits, said modular socket apparatus comprising:

circuit board means for interfacing the plurality of semiconductor circuits with the electronic device, said circuit board means having first and second sides, said first side including connector means for removably receiving the plurality of semiconductor circuits, said circuit board means further including a plurality of contacts;

a lead pattern positioned on said first side of said circuit board means, said lead pattern including four sides wherein each one of said four sides includes a plurality of substantially parallel leads, said four sides being positioned in a generally rectangular configuration with said substantially parallel leads of adjacent sides having a generally orthogonal relationship, each of said four sides further including first and second ends and an intermediate portion wherein said substantially parallel leads etched on said intermediate portion of each one of said four sides extends inwardly of said lead pattern farther than said substantially parallel leads at said first and second ends so that said plurality of leads will electrically mate with the plurality of leads of the plurality of semiconductor circuits, said substantially parallel leads of said lead pattern being electrically coupled to said plurality of contacts for electrically coupling the leads of the semiconductor circuits with the plurality of contacts; and data processing means for the at least first and second electrical signals, said data processing means being responsive to user provided input to selectively couple the at least first and second electrical signals to said plurality of contacts so that different ones of the at least first and second electrical signals can be provided to selective ones of said plurality of contacts.

* * * * *